United States Patent
Naito et al.

(10) Patent No.: US 9,159,463 B2
(45) Date of Patent: Oct. 13, 2015

(54) CONDUCTIVE MATERIAL

(71) Applicants: Katsuyuki Naito, Tokyo (JP); Norihiro Yoshinaga, Kawasaki (JP); Yoshihiko Nakano, Yokohama (JP); Yoshihiro Akasaka, Kawasaki (JP); Shigeru Matake, Yokohama (JP)

(72) Inventors: Katsuyuki Naito, Tokyo (JP); Norihiro Yoshinaga, Kawasaki (JP); Yoshihiko Nakano, Yokohama (JP); Yoshihiro Akasaka, Kawasaki (JP); Shigeru Matake, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 499 days.

(21) Appl. No.: 13/625,194

(22) Filed: Sep. 24, 2012

(65) Prior Publication Data

US 2013/0081678 A1 Apr. 4, 2013

(30) Foreign Application Priority Data

Sep. 30, 2011 (JP) .................. 2011-218680

(51) Int. Cl.
*H01L 31/0224* (2006.01)
*H01B 1/02* (2006.01)
*H01B 1/04* (2006.01)
*C23C 16/26* (2006.01)

(52) U.S. Cl.
CPC *H01B 1/02* (2013.01); *C23C 16/26* (2013.01); *H01B 1/04* (2013.01); *H01L 31/022425* (2013.01); *H01L 31/022466* (2013.01); *Y02E 10/549* (2013.01); *Y10T 428/256* (2015.01); *Y10T 428/26* (2015.01); *Y10T 428/266* (2015.01)

(58) Field of Classification Search
CPC .... H01B 1/02; H01B 1/04; H01L 31/022425; H01L 31/022466
USPC .......................................... 136/256
See application file for complete search history.

(56) References Cited

U.S. PATENT DOCUMENTS

| 6,914,372 B1 * | 7/2005 | Akiyama et al. ............. 313/309 |
| 2004/0110052 A1 | 6/2004 | Srinivas |
| 2011/0030991 A1 | 2/2011 | Veerasamy |
| 2011/0284805 A1 * | 11/2011 | Samulski et al. ............ 252/503 |
| 2012/0098028 A1 | 4/2012 | Naito |
| 2013/0180912 A1 * | 7/2013 | Li ............................ 210/500.21 |
| 2014/0042390 A1 * | 2/2014 | Gruner et al. .................. 257/14 |

FOREIGN PATENT DOCUMENTS

| CN | 1378700 A | 11/2002 |
| CN | 1656571 A | 8/2005 |
| CN | 101717083 A | 6/2010 |
| JP | 2007-157372 | 6/2007 |
| TW | 201111278 A | 4/2011 |

OTHER PUBLICATIONS

Mousavi et al., Nitrogen and Boron Doping Effects ont he Electrical Conductivity of Graphene and Nanotube, Solid State Sciences, vol./issue 13, pp. 1459-1464 (2011).*

(Continued)

*Primary Examiner* — Jayne Mershon
(74) *Attorney, Agent, or Firm* — Oblon, McClelland, Maier & Neustadt, L.L.P.

(57) ABSTRACT

According to one embodiment, a conductive material includes a carbon substance and a metallic substance mixed with and/or laminated to the carbon substance. The carbon substance has at least one dimension of 200 nm or less. The carbon substance includes a graphene selected from single-layered graphene and multi-layered graphene, a part of carbon atoms constituting the graphene is substituted with a nitrogen atom. The metallic substance includes at least one of a metallic particle and a metallic wire.

20 Claims, 4 Drawing Sheets

(56) References Cited

OTHER PUBLICATIONS

U.S. Appl. No. 14/191,904, filed Feb. 27, 2014, Naito, et al.
Combined Office Action and Search Report issued Apr. 17, 2015 in Chinese Patent Application No. 201210371692.1 (with English language translation).
U.S. Appl. No. 13/426,754, filed Mar. 22, 2012, Katsuyuki Naito.
Yi-Tao Liu, et al., "The production of flexible and transparent conductive films of carbon nanotube/graphene networks coordinated by divalent metal (Cu, Ca or Mg) ions", Carbon 49, 2011, 5 pages.
Chao Xu, et al., "Graphene-Metal Particle Nanocomposites", J. Phys. Chem. C, 112, 2008, pp. 19841-19845.
Chinese Office Action issued Oct. 10, 2014, in China Patent Application No. 201210371692.1 (with English translation).

\* cited by examiner

CONDUCTIVE MATERIAL

CROSS-REFERENCE TO RELATED APPLICATIONS

This application is based upon and claims the benefit of priority from Japanese Patent Application No. 2011-218680, filed Sep. 30, 2011, the entire contents of which are incorporated herein by reference.

FIELD

Embodiments described herein relate generally to a conductive material and an electric element using thereof.

BACKGROUND

Conventionally, a conductive material obtained by using a carbon substance such as a carbon fiber, a carbon nanotube or graphene as well as an electric device such as a photoelectric conversion device obtained by using the conductive material, such as a liquid crystal display, a solar cell, an organic EL device or an optical sensor, have been developed.

In the case of the conductive material obtained by using the carbon substance, rare metal or the like is not used or the amount used of the rare metal can be significantly reduced. Attention has been paid to the conductive material since it has a high flexibility and a strong mechanical strength and is chemically stable.

However, although the conductive material obtained by using the carbon substance has a relatively high conductivity, the resistance in conduction between molecules is large. In the case where the conductive material is used as a transparent electrode with a large area, the electric resistance becomes higher in the same light transmission compared to an indium tin oxide (ITO) film. In the case where the conductive material is used as a long-distance wire or the like, the electric resistance is still higher compared with a metal conductive material such as copper (Cu).

Accordingly, the carbon substance is complexed with metal or semiconductor particles or wires to improve the conductivity.

Electric devices such as a liquid crystal display, a solar cell, an organic EL device have two electrodes and a functional layer sandwiched therebetween. As the transparent electrode, the indium tin oxide (ITO) film is generally used.

As the negative electrode of photoelectric conversion devices such as a solar cell or an organic EL device, aluminum (Al), which has a small work function, or a magnesium (Mg) alloy, which has a smaller work function than Al, is used. A photoelectric conversion device is disclosed, which uses the ITO film as a negative electrode and metal having a large work function as a positive electrode.

As an inexpensive, stable, and flexible transparent electrode obtained without using indium (In) which is the rare metal to be used for the ITO film, a carbon nanotube having an unsubstituted graphene structure or a planar graphene thin film has been examined.

DETAILED DESCRIPTION

In general, according to one embodiment, a conductive material includes a carbon substance and a metallic substance mixed with and/or laminated to the carbon substance. The carbon substance has at least one dimension of 200 nm or less. The carbon substance includes a graphene selected from a single-layered graphene and a multi-layered graphene, a part of carbon atoms constituting the graphene is substituted with a nitrogen atom. The metallic substance includes at least one of a metallic particle and a metallic wire.

Hereinafter, the embodiments will be described using the drawings.

When the carbon substance is used for the conductive material, a relatively high conductivity is obtained. However, the resistance in conduction between molecules is large.

Thus, improvement in conductivity due to a complex of the carbon substance with particles or wires of metal or semiconductor has been developed.

However, even in the case of the complex, a significant improvement in conductivity is not obtained due to the bonding resistance of the carbon substance to the metallic substance. A large mechanical force such as treatment at high temperatures or compression is needed in order to reduce the bonding resistance. When the bonding of the carbon substance to the metallic substance is insufficient, there is a problem in that an internal battery is formed and the corrosion of the metallic substance is easily caused.

In the carbon substance as a single body, a structure where charges are trapped is easily formed, which is not preferred as the conductive material.

In an electric device obtained by using the carbon substance as the conductive material for electrodes, the drive voltage is increased due to the high electric resistance and easy trapping of the charges. Further, the operation of the device becomes unstable or the life-time becomes shorter.

To solve the conventional problems, embodiments of the present invention provides a conductive material with stable, high conductivity and an electric element using thereof.

First Embodiment

Figure 1:
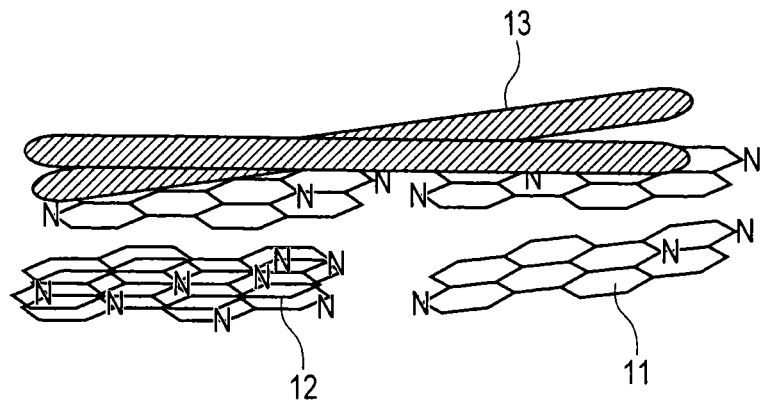
FIG. 1 is a schematic view showing a conductive material of a first and of a third embodiment.

FIG. 1 is a schematic view showing an example of a conductive material 10 of this embodiment.

The carbon substance is selected from a single-layered graphene 11 and a multi-layered graphene 12. The carbon substance has at least one dimension of 200 nm or less. In the single-layered graphene 11 and the multi-layered graphene 12, some carbon atoms are substituted with at least nitrogen atoms (N). Metal nanowires 13 as metallic wires are laminated.

As the carbon substance, the graphene is preferably in a thin-film shape and it may have a curved surface. The term "having at least one dimension of 200 nm or less" used herein means at least one of the thickness and the shortest width of a plane portion is 200 nm or less when the carbon substance is in a thin-film shape. When the carbon substance is not in a thin-film shape, but for example, in a curved surface shape, the term "having at least one dimension of 200 nm or less" used herein means that the diameter of curvature or length is 200 nm or less.

In this embodiment, the single-layered graphene 11 has at least one dimension of 200 nm or less. A part of carbon atoms in a graphene skeleton of a graphene are substituted with nitrogen atoms. The nitrogen atoms are classified into quaternary nitrogen, pyridine nitrogen, pyrrole/pyridone nitrogen, and nitrogen bonded to oxygen. The multi-layered graphene 12 is formed of a plurality of layers of the single-layered graphene 12 (e.g. two-layers).

Since a nanocarbon substance having at least one dimension of 200 nm or less is used, many bondings to a metallic substance to be mixed and/or laminated can be formed. At least one dimension is preferably 100 nm or less, more preferably 50 nm or less.

The nitrogen atoms substituting a part of carbon atoms of the graphene skeleton have a coordination ability to the metallic substance, and strengthen the bonding to the metallic substance. Additionally, the electron transfer is easily caused. The electric resistance of the interface between the carbon substance and the metallic substance is reduced. Further, it can protect a metallic substance which is easily oxidized or sulfurated.

In this embodiment, in the X-ray photoelectron spectroscopy (XPS) with the 1s electron of the nitrogen atoms, the intensity at 401.2 eV ($I_{401.2}$) is preferably larger than the intensity at 398.5 eV ($I_{398.5}$). The nitrogen atom corresponding to the intensity at 401.2 eV is a quaternary nitrogen atom, and the quaternary nitrogen atom supplies an electron to the graphene skeleton. Since the number of carriers is increased, the conductivity is increased.

On the other hand, the nitrogen atom corresponding to the intensity at 398.5 eV is a pyridine nitrogen atom. The pyridine nitrogen atom has accepting properties, inhibits effects of the quaternary nitrogen atom, and plays the role of an electron trap. However, the pyridine nitrogen atom has good bonding properties to metal and is effective in lowering contact barriers. Accordingly, the ratio ($I_{398.5}/I_{401.2}$) is preferably from 1/1.1 to 1/5.

The ratio of nitrogen atoms to carbon atoms (N/C) is preferably from 1/5 to 1/1000, more preferably from 1/10 to 1/200. When the amount of the nitrogen atoms is too small, an electronic effect is not sufficiently obtained. In contrast, when the amount of the nitrogen atoms is too large, disorder of the structure of the graphene skeleton is increased, resulting in a decrease in electrical conductivity.

In this embodiment, in the XPS, the ratio of the peak intensity of O1s near 530 eV of oxygen atoms ($I_{O1s}$) to the peak intensity of C1s near 285 eV of carbon atoms ($I_{C1s}$) preferably 1/10 or less. When the peak intensity ratio ($I_{O1s}/I_{C1s}$) is larger than 1/10, electrons are trapped due to the accepting properties of the oxygen atoms, resulting in a decrease in conductivity. More preferably, the peak intensity ratio ($I_{O1s}/I_{C1s}$) is from 1/50 to 1/300. When the peak intensity ratio is too small, it becomes unstable to external oxygens.

When measured from the product, the measurement by the XPS is achieved by exposing the surface of an electrode which is a target conductive material. Since the graphene is stable to various solvents (e.g., methanol), impurities adsorbed on the surface are removed by cleaning with a solvent. When oxygen molecules and water molecules are adsorbed, the peak intensity of oxygen atoms is different.

Thus, a sample is left in vacuum at 200° C. for one day or more, followed by measurement by the XPS.

The cyclic voltammogram can measure whether the electrons are trapped. As little as about 50 μg of the conductive material is applied to a glassy carbon electrode. Tetrabutylammonium bromide as an electrolyte is dissolved in a mixed solvent containing acetonitrile and water at a ratio of 2:1. A silver/silver chloride electrode is used as a reference electrode, and the potential is repeatedly scanned at −1.25 V to +0.6 V. When the electrons are trapped, the natural electrode potential is largely shifted to the minus side. Accordingly, it is possible to distinguish by measuring changes in the natural electrode potential.

The ratio of carbon atoms and oxygen atoms or nitrogen atoms can be measured by the elemental analysis using the burning method with a CHN analyzer or the like, when the amount of the wire is large. When the elemental analysis cannot be performed due to a thin-film shape and a small amount, like an electrode of an electric device, the ratio can be measured by the XPS. Since the signal sensitivity varies depending on the device, the signal strength of each element can be adjusted by using a material with known composition as a reference substance. For example, carbon nitride with a composition ratio of $C_3N_4$ can be used as a standard substance of C/N.

In this embodiment, it is preferable that an electron injection material be mixed with and/or laminated to the conductive material. The number of carriers is increased by the electron injection material and the conductivity is further increased. When the electron injection material is used as a negative electrode material such as a solar cell or an organic EL device, electron injection performance is increased. Usable examples of the electron injection material include salts of alkali metal or alkaline earth metal such as LiF, $CaF_2$, CsF, $Cs_2CO_3$, CsI, ZnO, and $TiO_2$; an n-type oxide semiconductor; an oligomer or polymer having a π electron system substituted with a plurality of electron withdrawing groups such as fluorine and cyano groups.

In this embodiment, it is preferable that a part of carbon atoms be further substituted with at least one selected from oxygen atom, boron atoms, phosphorus atoms, and arsenic atoms. Not only substitution with nitrogen atoms but also substitution with these atoms, work function, band gap, hydrophilicity, and hydrophobicity can be closely controlled. In supply of various kinds of electric devices for which the conductive material is used, the performance and production process can be closely controlled.

In this embodiment, the single-layered graphene 11 and a single-layered graphene constituting the multi-layered graphene 12 are preferably planar. This is because the bonding of a planar structure to a metallic substance is easier than that of a structure with a curvature such as a carbon nanotube. Note that the graphene of this embodiment may be a mixture or laminate of planar graphene and graphene having a curvature.

As the number of layers of graphene is increased, the conductivity is increased. However, the optical transparency is reduced. When the conductive material is used as a transparent electrode, the layer number is preferably 10 layers or less, more preferably 5 layers or less. A light transmittance of 60% or more at 550 nm wavelength is preferable.

When a conductive material which does not need transparency is used, the thickness is preferably 100 nm or less. From the viewpoint of bonding to the metallic substance, the thickness is preferably from 10 to 50 nm.

In the case of the carbon nanotube, the number of layers of the graphene can be measured using a transmission electron microscope (TEM) with high resolution. The number of layers of the planar graphene can be measured by the cross sectional observation using TEM.

In this embodiment, usable examples of the metallic particles and wires include silver (Ag), aluminum (Al), copper (Cu), gold (Au), tungsten (W), molybdenum (Mo) or an alloy thereof. Metallic carbon nanotubes can be also used.

Particularly, Ag is the most preferable because it has high conductivity, is stable, easily produces nano particles, can produce an electrode as a water dispersion, and has a high plasmon effect. Further, when a small amount of palladium (Pd) is added to Ag to form an alloy, the alloyed Ag becomes stable in the corrosive environment, such as a sulfur (S) component in the air or the like, which is more preferred. Since Al is inexpensive, has high conductivity, and is light, it is particularly preferred to apply to electrical wires.

Since Au is the most stable, it is preferred to apply to conductive materials such as semiconductors which particularly require reliability. Since Cu has high conductivity and is more inexpensive than Ag, it is preferred to apply to wire materials or wires. W is preferred to apply to conductive materials exposed to high temperatures or high voltages. Since Mo has a good bonding state, it is preferred to apply to electrodes for CIGS solar batteries.

In this embodiment, both of the metallic wires and the metallic particles to be described later may be contained. The metallic particles easily aggregate with the wires. The particles act as a binding material, and thus the metallic wires can be bonded to one another. The electric resistance as a conductive material is reduced.

In this embodiment, it is preferable to contain a metallic wire having at least one dimension of 200 nm or less. The metallic wire is preferably in a thin-film shape and it may have a curved surface. The term "having at least one dimension of 200 nm or less" used herein means that at least one of the thickness and the shortest width of a plane portion is 200 nm or less when the metallic wire is in a thin-film shape. When the metallic wire is not in a thin-film shape, but for example, in a curved surface shape, the term "having at least one dimension of 200 nm or less" used herein means that the diameter of curvature or length is 200 nm or less.

The size of the metallic wire is close to that of the carbon substance, which results in an easy complexation of the metallic wire with the carbon substance. Thus, the bonding becomes more excellent. At least one dimension of the wire is more preferably from 20 to 150 nm, still more preferably from 60 to 120 nm. The average length of the metallic wire is preferably from 1 to 100 µm. When the average length of the wire is too short, the number of tangles of wires is fewer and the electric resistance becomes high. In contrast, when the average length is too long, the dispersion to the solvent becomes unstable when producing electrodes. The average length of the wire is preferably from 5 to 50 µm.

The single- and multi-layered graphenes having carbon atoms at least partially substituted with nitrogen atoms in this embodiment can be produced, for example, by the following production method.

An example of a method of producing a single-layered graphene is as follows.

First, a single-layered graphene having carbon atoms partially substituted with nitrogen atoms is formed on Cu foil as a base catalyst layer by a chemical vapor deposition (CVD) method. In the CVD method, a mixed reaction gas containing ammonia, methane, hydrogen, and argon is used. Subsequently, the single-layered graphene is heat-treated in a mixed flow containing ammonia and argon so that nitrogen atoms are further doped to the single-layered graphene. Thereafter, it is cooled in an argon flow and the single-layered graphene is formed on the Cu foil.

It is preferable that the surface of the Cu foil is previously annealed by heat-treatment with laser radiation to increase the size of the crystal grain. Subsequently, the obtained single-layered graphene is pressure-bonded to a film for thermal transfer. The Cu foil is dissolved and the single-layered graphene is transferred to the transfer film. The Cu foil can be dissolved by immersing it in an ammonia alkaline copper (II) chloride etchant, a ferric chloride solution, or acids for dissolving Cu.

The single-layered graphene can be produced by transferring from the thermal transfer film to a substrate such as a polyethylene terephthalate (PET) film or a glass substrate.

The multi-layered graphene can be produced by repeatedly performing the same operation in the process of forming a single-layered graphene on the Cu foil in the method of producing a single-layered graphene and laminating it. Alternatively, the multi-layered graphene can be produced by using an Ni thin film in place of the Cu foil, heating it, and rapidly cooling it. The reason why the Ni foil is used when producing the multi-layered graphene is that carbon atoms are dissolved, at high temperatures, better in Ni than in Cu and thus many more carbon atoms are precipitated on the surface of Ni by rapidly cooling the foil. Also, when the Cu foil is used, the multi-layered graphene can be produced at once under the conditions of the CVD method.

When producing graphene having carbon atoms partially substituted with at least nitrogen atoms, it is possible to use low molecular weight nitrogen compounds such as pyridine, methylamine, ethylenediamine and urea in place of ammonia gas as a raw material for the CVD method. Ethylene, acetylene, methanol, ethanol, and the like may be used in place of methane.

Further, the graphene can be formed by a method including applying microwaves to Cu foil in a mixed atmosphere containing ammonia, methane, hydrogen, and argon to generate plasma in place of the thermal CVD method.

As another production method, the following production method is listed.

A dispersion liquid of oxidized graphene is spin-coated on quartz glass or metallic foil (e.g., on Cu foil) to produce a thin film. Thereafter, the film is heat-treated in a mixed atmosphere containing ammonia, hydrogen, and argon and nitrogen-substituted, followed by transfer of the resulting film to produce graphene. Alternatively, an oxidized graphene thin film is treated with hydrazine and/or heated, followed by transfer of the resulting film to produce graphene.

Alternatively, an unsubstituted graphene thin film is treated in nitrogen plasma to produce graphene. Further, a polymeric nitrogen-containing compound such as polyacrylonitrile or polyimide is applied onto quartz glass or metal to form a thin film. The film is heated in vacuum or argon to form a graphitized film. The resulting film may be transferred on another substrate. Further, a graphene thin film can be produced by preparing a dispersion liquid of nitrogen-substituted graphene, applying it, and filtrating it through a filter.

A carbon nanotube which is a cylindrical single-layered graphene and a multi-layered graphene having carbon atoms partially substituted with at least nitrogen atoms can be produced by the CVD method.

Specifically, a carbon nanotube having carbon atoms partially substituted with nitrogen atoms is produced by a CVD method using nano particles of iron or nickel as a catalyst and using a mixed reaction gas containing ammonia, methane, hydrogen, and argon. Subsequently, the nanotube is heat-treated in a mixed flow containing ammonia and argon, cooled in an argon flow, and the doping of nitrogen atoms to the nanotube is achieved.

As a raw material for the CVD method, low molecular weight nitrogen compounds such as pyridine, methylamine, ethylenediamine and urea may be used in place of ammonia gas. Ethylene, acetylene, methanol, ethanol, and the like may be used in place of methane.

The metallic wire used in this embodiment can be produced by reducing a metal ion solution using various reducing agents. The shape and size can be controlled by selecting the type of the reducing agent to be used, protective polymer, and coexisting ions. Particularly, in the case of Ag wire, it is preferable that polyhydric alcohol such as ethylene glycol is used as the reducing agent, and polyvinyl pyrrolidone is used as the protective polymer. So-called nanowires with nano order can be obtained by these production methods.

The conductive material of this embodiment can be obtained by mixing and/or laminating the carbon substance and the metallic substance. For example, the conductive material can be produced by laminating metallic wires to the single-layered and/or multi-layered graphene obtained by the CVD method by a coating method or the like and further alternately laminating.

According to this embodiment, there can be provided a conductive material with stable, high conductivity and an electric device using thereof. Particularly, since the wires are used as metallic substance, the conductivity is high and the mechanical strength is also improved.

Second Embodiment

Subsequently, the conductive material of a second embodiment according to the present invention will be explained.

Note that the repetitive descriptions of the same parts as those in the first embodiment are omitted.

Figure 2:
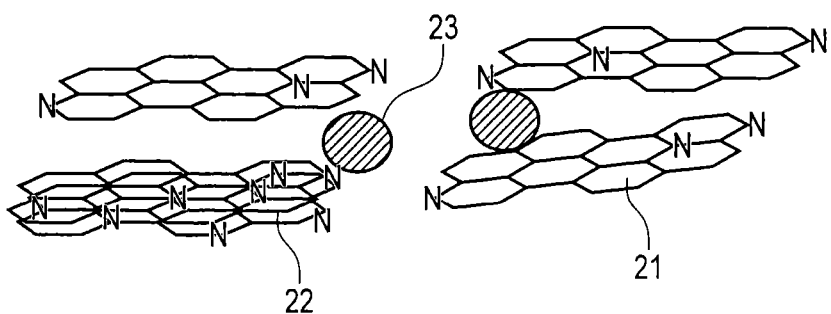
FIG. 2 is a schematic view showing a conductive material of a second embodiment.

FIG. 2 is a schematic view showing an example of a conductive material 20 of this embodiment.

A carbon substance which is formed of a single-layered graphene 21 and a multi-layered graphene 22 having one dimension of 200 nm or less is used. In the single-layered graphene 21 and the multi-layered graphene 22, a part of carbon atoms are substituted with at least nitrogen atoms (N). Metallic nano particles 23 as metallic particles are mixed.

In this embodiment, it is preferable to contain metallic particles having at least one dimension of 200 nm or less. The metallic particles are preferably in a thin-film shape and it may have a curved surface. The term "having at least one dimension of 200 nm or less" used herein means at least one of the thickness and the shortest width of a plane portion is 200 nm or less when the metallic particles are in a thin-film shape. When the metallic particles are not in a thin-film shape but, for example, in a curved surface shape, the term "having at least one dimension of 200 nm or less" used herein means that the diameter of curvature and length is 200 nm or less.

The size of the metallic particles is close to that of the carbon substance, which results in an easy complexation of the metallic particles with the carbon substance. Thus, the bonding becomes more excellent. At least one dimension of metallic particles is more preferably from 1 to 100 nm, still more preferably from 3 to 50 nm. The particle diameter of metallic particles is preferably from 3 to 50 nm. When the particle diameter is too small, the particles become unstable and are easily affected by oxidation or the like. On the contrary, the particle diameter is too large, an aggregated particle becomes larger and the dispersion with the carbon substance becomes difficult.

In this embodiment, both of metallic particles and the metallic wires may be contained. The metallic particles easily aggregate with the wires. The particles act as a binding material, and thus the metallic wires can be bonded to one another. The electric resistance as a conductive material is reduced.

The metallic particles used in this embodiment can be produced by reducing a metal ion solution using various reducing agents. The shape and size can be controlled by selecting the type of the reducing agent to be used, protective polymer, and coexisting ions. Particularly, in the case of Ag particles, it is preferable that alcohols or sodium borohydride is used as the reducing agent, and an amphiphilic long-chain alkyl compound is used as a protective agent.

The conductive material of this embodiment can be obtained by mixing and/or laminating the carbon substance and the metallic substance. For example, the conductive material can be produced by laminating metallic particles to the single-layered and/or multi-layered graphene obtained by the CVD method by a coating method or the like and further alternately laminating.

Alternatively, the conductive material can be produced by applying a dispersion liquid of oxidized graphene and metallic particles or metallic wires or filtrating it through a filter to produce a composite material, followed by reduction to form graphene or introduction of nitrogen. Further, the conductive material can be produced by applying a dispersion liquid of nitrogen-substituted graphene or nitrogen-substituted carbon nanotube and metallic particles or metallic wires or filtrating it through a filter.

According to this embodiment, there can be provided a conductive material with stable, high conductivity and an electric device using thereof. Particularly, since particles are used as metallic substance, the dispersion with the carbon substance becomes easier and a uniform and stable conductive material can be obtained.

Third Embodiment

Subsequently, the conductive material of a third embodiment according to the present invention will be explained.

Note that the repetitive descriptions of the same parts as those in the first and second embodiment are omitted.

FIG. 1 is also a schematic view showing an example of a conductive material 10 of this embodiment.

The carbon substance is selected from a single-layered graphene 11 and a multi-layered graphene 12. In the single-layered graphene 11 and the multi-layered graphene 12, some carbon atoms are substituted with at least nitrogen atoms (N). Metal nanowires 13 of which diameter is 200 nm or less as metallic wires are laminated.

Fourth Embodiment

Subsequently, the electric device of a fourth embodiment according to the present invention will be explained.

Note that the repetitive descriptions of the same parts as those in the first, second and third embodiments are omitted herein.

Figure 3:
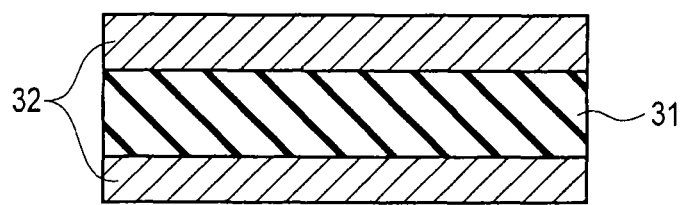
FIG. 3 is a schematic view showing a photoelectric conversion device of a fourth embodiment.

FIG. 3 is a schematic view showing an example of a photoelectric conversion device 30 which is an example of the electric device of this embodiment.

The photoelectric conversion device 30 has a photoelectric conversion layer 31 as a functional layer and a pair of electrodes 32.

At least one of the electrodes 32 is formed of a conductive material prepared by mixing and/or laminating a carbon substance which has at least one dimension of 200 nm or less disposed on one surface of the photoelectric conversion layer 31 and is formed of at least one of single- and multi-layered graphenes having carbon atoms partially substituted with at least nitrogen atoms; and a metallic substance formed of at least one of metallic particles and metallic wires. It is preferable to use the conductive material of this embodiment, particularly for a negative electrode of the electrodes 32.

In this embodiment, in the X-ray photoelectron spectroscopy with the 1s electron of the nitrogen atoms, the intensity at 401.2 eV is larger than the intensity at 398.5 eV. Thus, the work function becomes smaller than that of unsubstituted graphene. When the conductive material of this embodiment is used for the negative electrode of the electrodes 32, an energy barrier with the photoelectric conversion layer 31 becomes small, thereby allowing for efficient exchange of electrons.

Further, the negative electrode of the electrodes 32 of this embodiment is preferably transparent. This is because metal or semiconductor which is opaque and stable and has a large work function, or the like, can be used as the positive electrode.

In this embodiment, the work function of the negative electrode of the electrodes 32 is preferably equal to or smaller than that of Al. This is because exchange of electrons between the photoelectric conversion layer and the negative electrode is smoothly performed.

In this embodiment, it is preferable that carbon atoms are partially further substituted with at least one selected from oxygen atom, boron atoms, phosphorus atoms, and arsenic atoms. Not only by substitution with nitrogen atoms but also by substitution with these atoms, work function, band gap, hydrophilicity, and hydrophobicity can be closely controlled. As a result, the performance and production process of the photoelectric conversion device can be closely controlled.

In this embodiment, it is preferable that metallic wires (not shown) are formed at an electrode. This allows the electric resistance of the electrode to be further reduced. Usable examples of the material of the metallic wire include Au, Cu, Ag, titanium (Ti), W, and Al. It is preferable to use an Ag paste which can be produced by the coating method or metallic foil which can be attached and pressure-bonded.

Known materials can be used for the photoelectric conversion layer 31 in this embodiment. It is preferable that the photoelectric conversion layer is formed of at least n-type and p-type materials and both of the materials are present as separate layers. When the n-type and p-type materials are present in a single-layer, it is preferable that they are almost separated. This allows efficient charge separation or charge injection.

In the case of the solar cell, usable examples of the photoelectric conversion layer 31 include a bulk heterojunction organic thin-film layer, a silicon semiconductor, inorganic compound semiconductors such as InGaAs, GaAs, a chalcopyrite type, a CdTe type, an InP type, and an SiGe type, a quantum-dot containing type, and a dye sensitized type. In the case of using any of them, the efficiency is high and a deterioration in output performance can be reduced by simple sealing without using the water remover and the oxygen remover.

In the case of the organic EL device, usable examples thereof include a low-molecular thin film produced by vacuum deposition, a polymer thin film produced by the coating method, and an inorganic compound semiconductor. In any of these cases, the efficiency is high and deterioration in output performance can be reduced by simple sealing without using the water remover and the oxygen remover.

In this embodiment, the photoelectric conversion layer 31 contains preferably an organic thin film. The graphene structure which is used for the negative and positive electrodes is a condensed benzene-ring structure and likely to interact with an organic thin film having an aromatic ring which is similarly used for the photoelectric conversion layer so that a good interface can be formed.

It is preferable that the photoelectric conversion layer 31 of this embodiment contains a constituent element produced by the coating method. When the photoelectric conversion layer 31 can be formed by the coating method, it is possible to support large area and low cost requirements. However, it is difficult to completely eliminate an influence of water or oxygen by the coating method. The negative electrode of this embodiment which is stable to water or oxygen can reduce the influence.

It is preferable to dispose an electron injection layer (not shown) between the negative electrode of the electrodes 32 and the photoelectric conversion layers 31. The electron injection layer serves to reduce a barrier against an electron injection (in the case of organic EL devices or the like) from the negative electrode to the photoelectric conversion layer 31 or an electron injection from the photoelectric conversion layer 31 to the negative electrode (in the case of solar cells or the like) and has blocking properties which prevent the flow of holes. Thus, the energy conversion efficiency can be increased.

Usable examples of the electron injection layer include salts of alkali metal or alkaline earth metal such as LiF, $CaF_2$, $CsCO_3$, ZnO, and $TiO_2$; an n-type oxide semiconductor; an oligomer or polymer having a n electron system substituted with a plurality of electron withdrawing groups such as fluorine and cyano groups.

The conductive material of this embodiment can be used for the positive electrode which is disposed on the opposite side of the surface where the negative electrode is disposed. In this case, it is preferable that the nitrogen content is not high. This is effective in increasing an interaction between the functional layer and metallic particles and/or wires.

It is possible to use other known materials, which are conventionally used, for the positive electrode of this embodiment. Preferably, a metal, alloy or semiconductor which has a relatively large work function and is relatively stable to moisture, oxygen or the like is used for the positive electrode. The use of these materials enables it to dispense with improvement in the duration and tight sealing, thereby enabling cost reduction and flexibility.

Preferably, a material having a larger work function than Al is used for the positive electrode. The material having a larger work function than Al is more stable to moisture or oxygen. Examples of the material having a larger work function than Al include Cu, Ag, stainless steel (SUS304, SUS310S, high-nitrogen stainless steel, stainless steel covered with a conductive highly corrosion-resistant film, or the like), zinc, titanium, tungsten, molybdenum, chromium, nickel, alloys of these, an ITO, unsubstituted planar graphene, planar graphene substituted with boron atoms, an unsubstituted carbon nanotube, and a carbon nanotube substituted with boron atoms.

Particularly, the positive electrode preferably includes an unsubstituted single-layered graphene or multi-layered graphene, or single-layered graphene, or multi-layered graphene substituted with boron atoms. The unsubstituted graphene has a work function approximately equal to that of graphite. The graphene substituted with boron atoms has a larger work function than graphite. These cases are preferable for the positive electrode. Preferably, both the electrodes include graphene to enable flexibility of the photoelectric conversion device.

A value of the work function depends significantly on a surface structure or adsorption of other atoms. The work function can be measured by a Kelvin method (vibration capacity method), thermionic electron emission, or a photoelectric emission experiment.

In this embodiment, a hole injection layer (not shown) is preferably provided between the positive electrode and the photoelectric conversion layer 31. The hole injection layer serves to reduce a barrier against a hole injection from the positive electrode to the photoelectric conversion layer 31 (organic EL elements or the like) or a hole injection from the photoelectric conversion layer 31 to the positive electrode (solar cells or the like), and has blocking properties which prevent the flow of electrons. Thus, the energy conversion efficiency can be increased.

Usable examples of the hole injection layer include p-type semiconductors such as a complex of poly (3,4-ethylenedioxythiophene) and poly (styrenesulfonic acid) (PEDOT/PSS), vanadium oxide ($V_2O_5$), and molybdenum oxide ($MoO_3$).

In this embodiment, graphene of the negative electrode is preferably doped with electron donating molecules or atoms. Or, graphene of the positive electrode is preferably doped with electron accepting molecules or atoms. The doping improves electric conductivity of graphene and facilitates electron injection and hole injection to each electrode formed of a conductive material prepared by using graphene.

Usable examples of the electron donating molecules include phthalocyanines, ferrocenes, porphyrins, TTFs, phenylenediamines, tertiary amines, quarternary ammonium salts, and quarternary phosphonium salts. Usable examples of the electron donating atoms include alkaline metals, alkaline earth metals, aluminum, zinc, and iron. Particularly, it is preferable that the donating molecules or atoms on the negative electrode are unevenly distributed at the positive electrode direction. This allows for efficient charge separation and injection.

Usable examples of the metal to be used include ions or nano particles. Usable examples of the electron accepting molecule include TCNQs, quinones, halogen molecules, quinonediimines, nitric acid, hydrochloric acid, sulfuric acid, perchloric acid, gold trichloride, and iron trichloride. The halogen molecules to be used are doped in an atomic (ionic) state such as chlorine ions. Particularly, it is preferable that the accepting molecules on the positive electrode are unevenly distributed at the negative electrode direction. This allows for efficient charge separation and injection.

In this embodiment, the positive electrode is preferably transparent. This allows the negative and positive electrodes to be transparent. For example, electricity can be generated using light through both the electrodes in a solar cell, while light can be emitted to both electrodes due to the transparency in an organic EL device or the like. The photoelectric conversion device 30 of this embodiment is effectively used particularly for a window or the like. When the photoelectric conversion device is used for an optical sensor, deices measuring different wavelengths can be laminated.

In this embodiment, the negative electrode, the photoelectric conversion layer 31, and the positive electrode are preferably sealed, and the water remover or the oxygen remover is preferably not contained. This dispenses with a space for these removers and structural materials, thereby enabling a more flexible and inexpensive element.

The negative electrode, the photoelectric conversion layer 31, and the positive electrode can be sealed using an epoxy resin, a silicone resin, polyolefin or the like.

The electrodes in this embodiment are formed of a carbon substance which has at least one dimension of 200 nm or less and includes single-layered and/or multi-layered graphenes having carbon atoms partially substituted with at least nitrogen atoms. Such electrodes can be produced by the same method as the conductive material explained in the first, second and third embodiments.

Unsubstituted single-layered and/or multi-layered graphenes which are used for the positive electrode can be produced by, for example, the following method.

The single-layered graphene is first formed by the CVD method using Cu foil as a base catalyst layer and using a mixed reaction gas containing methane, hydrogen, and argon. Thereafter, the single-layered graphene is transferred to a PET film. The multi-layered graphene can be produced by repeatedly performing the same lamination operation.

When a metallic grid wire for current collection is formed on the conducting material, a conductive paste such as Ag is printed, or a conductive ribbon such as Al foil is pressure-bonded. The graphene substituted with boron atoms may be produced by similarity using a mixed reaction gas containing diborane, methane, hydrogen, and argon.

When the electron injection layer is formed between the negative electrode and the photoelectric conversion layer 31, it is preferable to include a step of forming the electron injection layer before the formation of the photoelectric conversion layer 31 on the negative electrode after the formation of the negative electrode.

In this embodiment, when the hole injection layer is formed between the photoelectric conversion layer 31 and the positive electrode, it is preferable to form the injection layer before the formation of the positive electrode on the photoelectric conversion layer 31.

After the formation of the respective layers (i.e., the electron injection layer and the hole injection layer), the respective layers are preferably heated simultaneously with pressure bonding or heated after pressure bonding to make good interface bonding therebetween. This enables the interface bonding between the respective layers to be good.

In this embodiment, a second photoelectric conversion layer (not shown) is preferably formed after the formation of the photoelectric conversion layer 31 on the negative electrode. The formation of the second photoelectric conversion layer further improves efficiency. Further, it allows absorption/emission of light having different wavelengths. The two photoelectric conversion layers may be directly contacted to each other, or may be formed via a conductive layer, or may be provided with a buffer layer such as a very thin insulating layer.

The second photoelectric conversion layer may include the same material and structure as those of the other photoelectric conversion layer or may include a different material and structure. Further, a step of sticking the two photoelectric conversion layers to each other may be included. The layers are more preferably heated after sticking them. This enables the interface bonding between the respective layers to be good.

Note that a carbon nanotube may be used instead of the single-layered graphene and/or multi-layered graphene partially substituted with nitrogen atoms to be used for the negative electrode. In this case, the carbon nanotubes are produced by the CVD method in a gas stream containing ammonia so that carbon nanotubes produced are uniformly-sized as much as possible. The uniformly-sized nanotubes are subjected to spin coating or dipping coating to form a transparent negative electrode.

In this embodiment, the photoelectric conversion layer 31 as a functional layer generates photovoltaic power. The electrodes formed of the conductive material of this embodiment are preferably positioned at the light incidence side. As already explained, in the conductive material of this embodiment, the carbon substance and the metallic substance are mixed and/or laminated. The carbon substance has at least one dimension of 200 nm or less and is formed of at least one of single- and multi-layered graphenes having carbon atoms partially substituted with at least nitrogen atoms. The metallic substance is formed of at least one of metallic particles and metallic wires.

When a metallic substance having a dimension of 200 nm or less is mixed into the conductive material, light scattering occurs. The light pass increases. When the material of the metallic substance is silver, gold, aluminum or the like, in such a metallic substance, the surface plasmon is induced and the efficiency of absorption of light by the functional layer is improved, which results in an improvement in the efficiency of a device with photovoltaic power, such as a solar cell or an optical sensor. When the electrode is positioned at the light incidence side receiving light, such an effect is generated before absorption of light by the functional layer. Thus, this is efficient. Since a thin carbon layer can be inserted between the functional layer and metallic substance, deactivation of the metallic surfaces of photoexcitons can be reduced.

Preferably, this embodiment comprises that the photoelectric conversion layer 31 as the functional layer are divided into pixels to be displayed, and the electrodes 32 formed of a conductive material including a carbon substance are opposed to the display side. As described above, when metallic particles and/or metallic wires having a dimension of 200 nm or less are mixed into the conductive material, light scattering occurs.

White turbidity is caused by light scattering. Thus, when the electrodes 32 formed of a conductive material including a carbon substance are positioned at the display side, it becomes a little hard to see the display. On the other hand, in the case of the electrodes opposed to the display side, the display becomes bright since the reflected light can be used for an organic EL display or the like. This is convenient, particularly for a transparent display having electrodes that transmit visible light.

Preferably, this embodiment comprises that the photoelectric conversion layer 31 as the functional layer emits light and the electrodes 32 formed of a conductive material including carbon and metallic substances of this embodiment are positioned at the side to take out light. As described above, when metallic particles and/or wires are mixed into the conductive material, light scattering occurs. This configuration is preferred because of being harmless for eyes and is also preferred as an electrode for organic EL illumination or inorganic LED illumination.

According to this embodiment, there can be provided a functional device which is stable and highly efficient and can be made transparent as the electric device.

Hereinafter, the photoelectric conversion device 30 of the third embodiment will be explained when limited to the solar cell and the organic EL device.

Fifth Embodiment

Subsequently, the solar cell device which is the electric device of a fifth embodiment according to the present invention will be explained.

Note that the repetitive descriptions of the same parts as those in the fourth embodiment are omitted herein.

Figure 4:
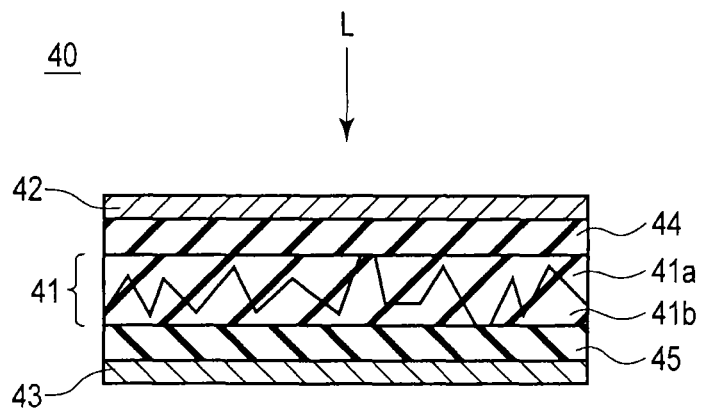
FIG. 4 is a schematic view showing a solar cell device of a fifth embodiment.

FIG. 4 is a schematic view showing an example of a solar cell device 40 of this embodiment.

The solar cell device 40 is a device serving as a solar cell to convert light energy into electricity. The light energy is energy of light L such as solar light incident on the cell.

The solar cell device 40 includes a photoelectric conversion layer 41, a negative electrode (front electrode) 42 formed on one surface of the photoelectric conversion layer 41, and a positive electrode (rear electrode) 43 formed on the opposite surface of the negative electrode 42 of the photoelectric conversion layer 41. The photoelectric conversion layer 41 is a semiconductor layer which converts light energy of incident light L into electricity to generate an electric current.

The photoelectric conversion layer 41 usually includes an n-type semiconductor layer 41$a$ and a p-type semiconductor layer 41$b$. In general, the interface between the semiconductor layers 41$a$ and 41$b$ is a convexo-concave structure as shown in FIG. 4 to enhance the light absorbing performance. An electron injection layer 44 is formed between the photoelectric conversion layer 41 and the negative electrode 42. A hole injection layer 45 is formed between the photoelectric conversion layer 41 and the positive electrode 43.

The conductive material including a carbon substance and a metallic substance of this embodiment is used for at least one of the negative electrode 42 and the positive electrode 43 in the solar cell element 40.

Note that the solar cell device (cell) of this embodiment can be also used as an optical sensor. The metal nanowire film and the graphene thin film have transparency in the visible light and near-infrared region so that the efficiency of the solar cell is increased. When a photoelectric conversion layer sensitive to the near-infrared region is used, it can be used as an infrared sensor.

According to this embodiment, there can be provided a solar cell device which is stable and highly efficient and can be made transparent as the solar cell device.

Sixth Embodiment

Subsequently, the organic EL device which is the electric device of a sixth embodiment according to the present invention will be explained.

Note that the repetitive descriptions of the same parts as those in the fourth embodiment are omitted.

Figure 5:
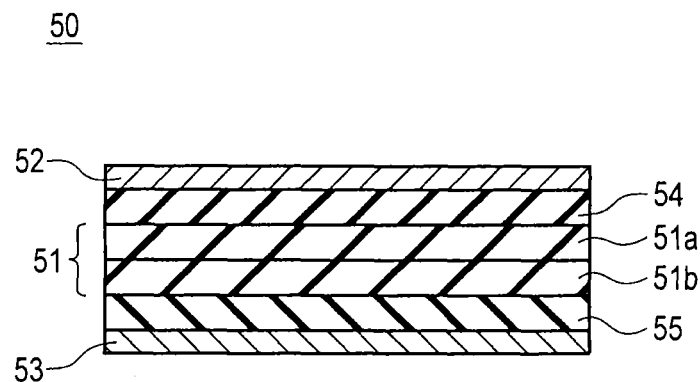
FIG. 5 is a schematic view showing an organic EL device of a sixth embodiment.

FIG. 5 is a schematic view showing an example of an organic EL device 50 of this embodiment.

The organic EL device 50 is an element serving as a light-emitting device to convert electric energy inputted to the device into light.

The organic EL device 50 includes a photoelectric conversion layer 51, a negative electrode (front electrode) 52 formed on one surface of the photoelectric conversion layer 51, and a positive electrode (rear electrode) 53 formed on the opposite surface of the negative electrode 52 of the photoelectric conversion layer 51. The photoelectric conversion layer 51 is an organic thin-film layer to recombine electrons injected from the front electrode and holes injected from the rear electrode, thereby converting electric energy into light.

The photoelectric conversion layer 51 usually includes an n-type semiconductor layer 51$a$ and a p-type semiconductor layer 51$b$. An electronic injection layer 54 is formed between the photoelectric conversion layer 51 and a negative electrode 52. A hole injection layer 55 is formed between the photoelectric conversion layer 51 and a positive electrode 53.

The conductive material including carbon and metallic substances of this embodiment is used for at least one of the negative electrode 52 and the positive electrode 53 in the organic EL device 50.

According to this embodiment, there can be provided an organic EL device which is stable and highly efficient and can be made transparent as the organic EL device.

Seventh Embodiment

Subsequently, the liquid crystal display which is the electric device of a seventh embodiment according to the present invention will be explained.

Note that the repetitive descriptions of the same parts as those in the fourth embodiment are omitted.

Figure 6:
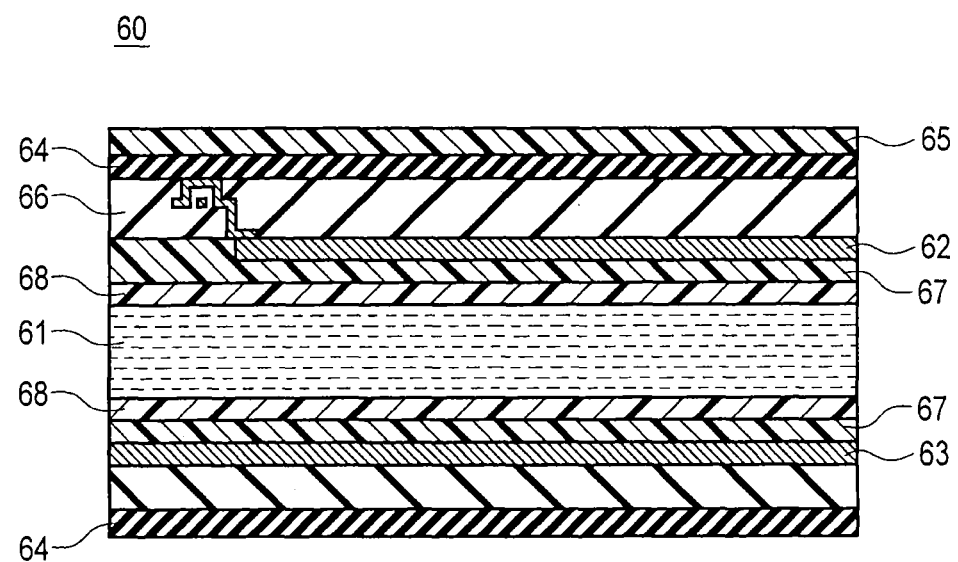
FIG. 6 is a schematic view showing a liquid crystal display of a seventh embodiment.

FIG. 6 is a schematic view showing an example of a liquid crystal display 60 of this embodiment.

FIG. 6 shows a structure of a pixel. A liquid crystal display 60 has a liquid crystal layer 61, a front electrode 62 formed at the display surface side, and a rear electrode 63 formed at the opposite side. A pair of polarization plates 64 is included outside a pair of electrodes. A color filter 65 and a TFT element 66 for driving are formed. A waveguide plate for backlight may be formed at the rear electrode side. An insulating film 67 and a liquid crystal orientation film 68 are formed on the respective electrodes.

The conductive material including carbon and metallic substances of this embodiment is used for at least one of the front electrode 62 and the rear electrode 63 in the liquid crystal display 60.

Preferably, this embodiment comprises that a functional layer such as the liquid crystal layer 61 is divided into pixels to be displayed, and the electrodes formed of the conductive material including carbon and metallic substances are opposed to the display side. As already described, when metallic particles and/or wires having one dimension of 200 nm or less are mixed into the conductive material, light scattering occurs.

White turbidity is caused by light scattering. Thus, when the electrodes formed of the conductive material including carbon and metallic substances of this embodiment are positioned at the display side, it becomes slightly hard to see the display. However, in the case of the rear electrode opposed to the display side, it does not become hard to see a display of the liquid crystal display 60.

According to this embodiment, there can be provided a stable, lightweight, and flexible liquid crystal display element as a liquid crystal display.

Eighth Embodiment

Subsequently, the light control device which is the electric device of an eighth embodiment according to the present invention will be explained.

Note that the repetitive descriptions of the same parts as those in the fourth embodiment are omitted.

Figure 7:
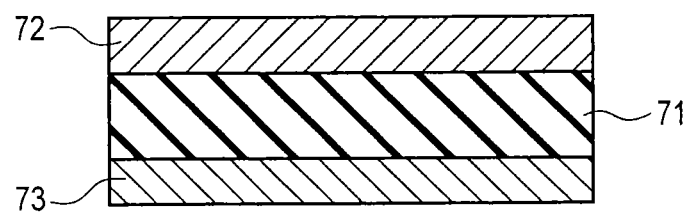
FIG. 7 is a schematic view showing a light control device of a eighth embodiment.

FIG. 7 is a schematic view showing an example of a light control device 70 of this embodiment.

The light control device 70 includes a light control layer 71, a front electrode 72 formed at the display surface side, and a rear electrode 73 formed at the opposite side. As the light control layer 71, an electrochromic layer or a polymer-dispersed type liquid crystal layer is preferably used so that a simple device structure can control light.

The conductive material including carbon and metallic substances of this embodiment is used for at least one of the front electrode 72 and the rear electrode 73 in the light control device 70.

According to this embodiment, there can be provided a lightweight and flexible light control device as a light control device.

Hereinafter, more specific examples of the embodiments will be shown.

Example 1

A conductive material 10 shown in FIG. 1 is produced. A planar single-layered graphen 11 having carbon atoms partially substituted with nitrogen atoms and a multi-layered graphene 12 such as a two-layered graphene are used as carbon substances. The metal nanowires 13 as metallic wires are laminated to such a carbon substance.

The planar single-layered graphen 11 having carbon atoms partially substituted with nitrogen atoms can be formed by the CVD method using Cu foil as a base catalyst layer. A mixed reaction gas containing ammonia: methane: hydrogen:argon at a ratio of 15:60:65:200 (ccm) is used and the CVD is performed at 1000° C. for 5 minutes. Most graphenes to be formed by the CVD method are single-layered graphenes. However, depending on the conditions, partially two-layered or multi-layered graphene may be produced. The graphene is treated in a mixed flow containing ammonia and argon at 1000° C. for 5 minutes, followed by cooling in an argon flow.

The surface of the Cu foil is previously annealed by heat-treatment with laser radiation to increase the crystal grain. The single-layered graphene obtained as a thermal transfer film is pressure-bonded and immersed in an ammonia alkaline copper (II) chloride etchant to dissolve Cu. Thus, the single-layered graphene is transferred to the thermal transfer film. Four layers of the single-layered graphene are laminated to the thermal transfer film by repeatedly performing the same operation.

The doping amount (N/C atomic ratio) of nitrogen in graphene can be estimated by the X-ray photoelectron spectroscopy (XPS). Under the conditions, the ratio of nitrogen atoms to carbon atoms is from 1/100 to 1/200. The ratio of oxygen atoms to carbon atoms in the carbon substance measured by XPS is from 1/100 to 1/200. In the X-ray photoelectron spectroscopy with the 1 s electron of the nitrogen atoms, the ratio of the intensity at 398.5 eV to the intensity at 401.2 eV ($I_{398.5}/I_{401.2}$) is from 1/10 to 1/25. The work function is measured under vacuum by the ultraviolet photoelectron spectroscopy (UPS) and it is equal to or lower than that of Al.

In producing the silver nanowires 13, an ethylene glycol solution of polyvinyl pyrrolidone is first heated to 160° C., a small amount of silver chloride is added thereto, followed by addition of silver nitrate and the resulting mixture is heated for 10 minutes. A solution or nano particles in the obtained solution are removed by multistep centrifugation to obtain the silver nanowires 13 (with an average diameter of 50 to 60 nm and an average length of 5 to 7 μm).

The silver nanowires are dispersed in methanol at a concentration of 3 mg/ml to prepare a dispersion liquid. The dispersion liquid is applied onto the laminated four layers of the above mentioned graphene using an applicator to laminate a film of the silver nanowires 13. Subsequently, the resulting layer is thermally transferred to a 150 μm-thick PET film to obtain the conductive material 10.

The conductive material obtained has a surface resistance of 20 to 30Ω/□ and a light transmission at 550 nm of 75 to 80%, and thus the transparency is high. Further, the conductive material is excellent in electric conduction in the surface direction and is flexible and stable. No change is observed in the electric conduction in the thickness direction after the bending tests of 500 times.

Comparative Example 1

In Comparative example 1, the carbon substance in Example 1 is changed. In place of the carbon substance which includes the planar multi-layered graphene 12 having carbon atoms partially substituted with nitrogen atoms, an unsubstituted graphene which is produced without using ammonia gas is used as the carbon substance. Other configurations are the same as those of Example 1.

The electric resistance in the thickness direction of the conductive material to be obtained increases 1.5 to 2-fold as compared to the case of Example 1. It was confirmed that the electric conduction in the thickness direction was reduced by the bending tests of 500 times and the bonding of the graphene film to the silver nanowire film was unstable.

Example 2

A conductive material 20 shown in FIG. 2 is produced. The planar single-layered graphen 21 in which some carbon atoms are substituted with nitrogen atoms and the multi-layered graphene 22 such as a two-layered graphene are used as carbon substances. The metallic nano particles 23 as metallic particles are mixed with such carbon substances.

In producing the silver nano particles 23, a solvent, isobutanol as a reducing agent and oleylamine (as a stabilizer) are used, and silver nitrate is heated at 115° C. for 4 hours. The reaction mixture is separated with a centrifuge to obtain the silver nano particles 23 with an average diameter of 20 to 30 nm.

The dispersion liquid of silver nano particles is mixed with a dispersion liquid of oxidized graphene prepared by oxidizing graphite and dispersing in water at a concentration of 3 mg/ml. The mass ratio of oxidized graphene and silver nano particles is set to 1:3. The most oxidized graphene is a single-layered graphene, and it partially includes two-layer or multilayer structures. The dispersion liquid is applied onto quartz glass using an applicator to have a liquid film in thickness of 20 μm. Subsequently, the oxidized graphene is reduced by bringing into contact with hydrated hydrazine vapor at 100° C. and nitrogen atoms are introduced. The resulting product is heated to 500° C. in nitrogen to obtain a thin-film conductive material. The conductive material obtained has high transparency and is excellent in electric conduction in the thickness direction.

The ratio of nitrogen atoms to carbon atoms of the carbon substance measured by XPS is from 1/100 to 1/50. The ratio of oxygen atoms to carbon atoms of the carbon substance measured by XPS is from 1/25 to 1/30. In the X-ray photoelectron spectroscopy (XPS) with the 1 s electron of the nitrogen atoms, the intensity at 398.5 eV to the intensity at 401.2 eV is from 1.1 to 1.4.

The conductive material obtained has high transparency, is excellent in electric conduction in the thickness direction, and is flexible and stable. No change is observed in the electric conduction in the thickness direction after the bending tests of 500 times.

Comparative Example 2

In Comparative example 2, the carbon substance in Example 2 is changed. Specifically, in place of the carbon substance which includes the planar single-layered graphen 21 in which some carbon atoms are substituted with nitrogen atoms and the multi-layered graphene 22 such as a two-layered graphene, the graphene reduced by sodium borohydride is used as the carbon substance. Other configurations are the same as those of Example 2.

The electric resistance in the thickness direction of the conductive material to be obtained increases 2 to 3-fold as compared to that of the conductive material of Example 2.

Comparative Example 3

A conductive material is produced in the same manner as described in Example 2 except that silver nano particles 23 to be mixed with the carbon substance is not used in Comparative example 3.

The electric resistance in the thickness direction of the conductive material to be obtained increases 3 to 4-fold as compared to that of the conductive material of Example 2.

Example 3

The solar cell element 40 shown in FIG. 4 is produced. The negative electrode 42 is formed by vapor-depositing an aluminum wire for current collection on a conductive material. The conductive material is obtained by laminating a metallic substance including silver nanowires to a carbon substance including a planar single-layered graphen having carbon atoms partially substituted with nitrogen atoms which is obtained in the same manner as Example 1.

The positive electrode 43 is a sheet obtained by transferring an unsubstituted planar single-layered graphene to a PET film. An unsubstituted single-layered graphene is formed by the CVD method using a mixed reaction gas containing methane, hydrogen, and argon and using Cu foil as the base catalyst layer.

In forming the photoelectric conversion layer 41 (120 nm in thickness), a $TiO_2$ nano particle thin film (10 nm in thickness) is formed on the negative electrode 42 to obtain an electron injection layer and a hole blocking layer 44. A photoelectric conversion layer 41a is formed by applying (6,6')-phenyl-C61-butyric acid methyl ester (PCBM), i.e., an n-type semiconductor, onto the hole blocking layer 44. Poly-3-hexylthiophene (P3HT), i.e., a p-type polymer semiconductor, is applied onto the photoelectric conversion layer 41a by spin coating to form a photoelectric conversion layer 41b.

At this time, a 1,2-dichlorobenzene solvent which can dissolve both the p-type and n-type semiconductors is used so that the surface area of the interface between the p-type and n-type semiconductors becomes large. The p-type semiconductor layer may be applied after the surface of the n-type semiconductor layer is formed to provide the surface with a physically minute convexo-concave structure by nanoimprinting or the like. The photoelectric conversion layer 41 may be formed by directly applying a mixed solution of P3HT and PCBM by spin coating.

On the other hand, the hole injection layer 45 (50 nm in thickness) was formed on the positive electrode 43 by applying a complex of poly(3,4-ethylenedioxythiophene) and poly(styrenesulfonic acid) (PEDOT/PSS) by spin coating. Then, lamination press is performed under reduced pressure at 80° C. so that the photoelectric conversion layer 41 is in contact with the hole injection layer 45 to produce the solar cell device 40.

The end surface of each layer is sealed with an epoxy resin.

Antireflection films (not shown) are attached to the surfaces of the PET films having the negative electrode 42 and the positive electrode 43 thereon.

The solar cell positive 40 thus obtained has two transparent surfaces to utilize light on both the surfaces efficiently. The solar cell device 40 has a high efficiency of energy conversion and shows relatively low deterioration of output performance even in the case of simple sealing and not containing a water remover or an oxygen remover. Additionally, the solar cell device 40 is light and flexible.

Comparative Example 4

In Comparative example 4, the negative electrode 42 in Example 3 is changed. Specifically, in place of the carbon substance which includes the multi-layered graphene partially substituted with nitrogen atoms, an unsubstituted graphene which is produced without using ammonia gas is used as the carbon substance to produce the negative electrode 42. Other configurations are the same as those of Example 3.

In the solar cell device 40 obtained, the longitudinal resistance of the device is increased as compared with Example 3. The energy conversion efficiency is reduced from one-third to half.

Example 4

The organic EL device 50 for illumination shown in FIG. 5 is produced. The negative electrode 52 is produced in the same manner as the conductive material constituted of the carbon substance and the metallic substance in Example 3.

The positive electrode 53 is produced in the same manner as the positive electrode 43 in Example 3.

In the formation of the photoelectric conversion layer 51, LiF (1.5 nm) is vapor-deposited on the negative electrode 52 to form an electronic injection layer 54. Tris (8-hydroxyquinoline) aluminum (Alq3) with a thickness of 40 nm is vapor-deposited on the electronic injection layer 54 to form an n-type semiconductor layer 51a. The n-type semiconductor layer 51a functions as an emissive layer.

N,N'-di-1-naphthyl-N,N'-diphenyl-1,1'-biphenyl-4,4'-diamine (NPD) (i.e., a p-type organic semiconductor) with a thickness of 30 nm is vapor-deposited on the n-type semiconductor layer 51a to form a p-type semiconductor layer 51b. The photoelectric conversion layer 51 is configured of the n-type semiconductor layer 51a and the p-type semiconductor layer 51b.

A composite containing poly (3,4-ethylenedioxythiophene)/poly (styrenesulfonate) (PEDOT-PSS) is applied onto the positive electrode 53 by spin coating to form a hole injection layer 55 (50 nm).

Lamination press is performed under reduced pressure at 80° C. so that the photoelectric conversion layer 51 is in contact with the hole injection layer 55 to produce the organic EL device 50.

The end surface of each layer is sealed with an epoxy resin.

Films (not shown) are attached to the surfaces of the PET films having the negative electrode 52 and the positive electrode 53 thereon. The films are provided with convexo-concave surfaces in order to enhance the light-extraction efficiency.

The organic EL device 50 thus obtained is transparent, is capable of double-sided light emission, and has a high light-emitting efficiency. Further, the organic EL element shows a relatively low rate of deterioration of emission intensity even in the case of simple sealing and not containing a water remover or an oxygen remover. Additionally, the organic EL device is light and flexible.

Comparative Example 5

In Comparative example 5, the negative electrode 52 in Example 4 is changed. Specifically, in place of the carbon substance which includes the multi-layered graphene partially substituted with nitrogen atoms, an unsubstituted graphene which is produced without using ammonia gas is used as the carbon substance to produce the negative electrode 52. Other configurations are the same as those of Example 4.

The drive voltage of the organic EL device obtained is increased as compared with Example 4, and thus the light-emitting efficiency is reduced more than half.

Example 5

The solar cell device 40 shown in FIG. 4 is produced. As the negative electrode 42, a sheet obtained by laminating silver nanowires on a mixed film of a metallic substance formed of a carbon substance and silver nano particles and transferring to a PET film is used. The carbon substance to be used is formed of planar single- and multi-layered graphenes having carbon atoms partially substituted with nitrogen atoms.

The dispersion liquid of silver nano particles to be produced in the same manner as Example 2 is mixed with a dispersion liquid of oxidized graphene prepared by oxidizing graphite and dispersing in water at a concentration of 3 mg/ml. The mass ratio of oxidized graphene and silver nano particles is set to 1:3. The most oxidized graphene is a single-layered graphene, and it partially includes two-layer or multilayer structures.

The dispersion liquid is applied onto quartz glass using an applicator to have a liquid film in thickness of 20 µm. Subsequently, the oxidized graphene is reduced by bringing into contact with hydrated hydrazine vapor at 100° C. and nitrogen atoms are introduced. The resulting product is heated to 300° C. in nitrogen to obtain a thin-film conductive material. The conductive material obtained has high transparency and is excellent in electric conduction in the thickness direction.

The silver nanowires (with an average diameter of 110 to 130 nm and an average length of 25 to 30 µm) are dispersed in methanol at a concentration of 3 mg/ml to prepare a dispersion liquid. The dispersion liquid is applied onto the four-layered graphene film using an applicator to Obtain a silver nanowire film. The film is dried in a nitrogen stream for 1 hour and transferred to the PET film having the aluminum wire for current collection thereon to form a conductive material. The conductive material obtained has a surface resistance of 10 to 20Ω/□ and a light transmission at 550 nm of 75 to 80%, and thus it is used as a transparent electrode film 42.

In forming the photoelectric conversion layer 41 (120 nm in thickness), a $TiO_2$ nano particle thin film (10 nm in thickness) is formed on the negative electrode 42 to obtain an electron injection layer and a hole blocking layer 44. A photoelectric conversion layer 41a is formed by applying (6,6')-phenyl-C61-butyric acid methyl ester (PCBM), i.e., an n-type semiconductor, onto the hole blocking layer 44. Poly-3-hexylthiophene (P3HT), i.e., a p-type polymer semiconductor, is applied onto the photoelectric conversion layer 41a by spin coating to form a photoelectric conversion layer 41b.

At this time, a 1,2-dichlorobenzene solvent which can dissolve both the p-type and n-type semiconductors is used so that the surface area of the interface between the p-type and n-type semiconductors becomes large. The p-type semiconductor layer may be applied after the surface of the n-type semiconductor layer is formed to provide the surface with a physically minute convexo-concave structure by nanoimprinting or the like. The photoelectric conversion layer 41 may be formed by directly applying a mixed solution of P3HT and PCBM by spin coating.

On the other hand, $MoO_3$ is vacuum-deposited (10 nm in thickness) onto stainless steel foil (SUS304) as the positive electrode 43 to form the hole injection layer 45. Then, lamination press is performed under reduced pressure at 80° C. so that the photoelectric conversion layer 41 is in contact with the hole injection layer 45 to produce the solar cell device 40.

The end surface of each layer is sealed with an epoxy resin.

Antireflection films (not shown) are attached to the surfaces of the PET films having the negative electrode 42 thereon.

The solar cell device 40 obtained in the above manner has a high energy conversion efficiency. The solar cell device 40 shows relatively low deterioration of output performance even in the case of simple sealing and not containing a water remover or an oxygen remover. Additionally, the solar cell device 40 is light and flexible.

Comparative Example 6

In Comparative example 6, a solar cell device 40 is produced in the same manner as Example 5 except that the negative electrode 42 is obtained without using the metallic substance including silver nanowires.

In the solar cell device 40 obtained, the longitudinal resistance and the sheet resistance of the device are increased as compared with Example 5. The energy conversion efficiency is reduced more than one-third.

Example 6

The liquid crystal display 60 shown in FIG. 6 is produced. The rear electrode 63 opposed to the display side is obtained by laminating a metallic substance formed of silver nanowires to a carbon substance formed of planar single- and multi-layered graphenes having carbon atoms partially substituted with nitrogen atoms.

In forming the planar graphene having carbon atoms partially substituted with nitrogen atoms, a polyacrylonitrile thin film is first casted on quartz glass and heated in air at 300° C. for 1 hour. Subsequently, the resulting product is heated at 1100° C. for 10 minutes in vacuum to form a graphitized film. The obtained structural body is transferred to a thermal transfer film in water.

The ratio of nitrogen atoms to carbon atoms of the carbon substance measured by XPS is from 1/20 to 7/100 under the conditions. The ratio of oxygen atoms to carbon atoms of the carbon substance measured by XPS is from 1/10 to 1/15. In the X-ray photoelectron spectroscopy (XPS) with the 1 s electron of the nitrogen atoms, the intensity at 398.5 eV to the intensity at 401.2 eV is from 1.25 to 0.8.

The silver nanowires (with an average diameter of 110 to 130 nm and an average length of 25 to 30 μm) are dispersed in methanol at a concentration of 2 mg/ml to prepare a dispersion liquid.

The dispersion liquid is applied onto the single-layered graphene film having the carbon atoms partially substituted with nitrogen atoms using an applicator to obtain a silver nanowire film. The film is dried in a nitrogen stream for 1 hour and transferred to the PET film having produced the aluminum wire for current collection thereon. A polyimide film as the insulating film 67 is produced on the PET film. Further, the liquid crystal orientation film 68 including another polyimide component is formed thereon.

An unsubstituted graphene film which is wire-connected to the TFT element 66 and divided into pixels as the front electrode 62 at the display side is on the PET substrate. The unsubstituted graphene film is formed by the CVD method using a mixed reaction gas containing methane, hydrogen, and argon and using Cu foil as the base catalyst layer. The obtained unsubstituted graphene film is transferred to a thermal transfer film and then transferred to the substrate on which the TFT element is produced.

The resulting film is coated with resist, followed by pattern exposure and development. Then, the graphene film is patterned by oxygen plasma to form a pixel electrode. A polyimide film as the insulating film 67 is produced on the electrode. Further, the liquid crystal orientation film 68 including another polyimide component is formed thereon.

The substrate having the front electrode is attached to the rear electrode substrate on the PET film via a spacer. Subsequently, a liquid crystal layer is injected under vacuum and the end surface is sealed with an epoxy resin. The pair of polarization plates 64 and a color filter 65 is formed outside to produce a liquid crystal display 60.

The liquid crystal display 60 thus obtained is flexible and light. No change is observed in the display performance after the bending tests of 500 times.

Comparative Example 7

In Comparative example 7, a liquid crystal display is produced in the same manner as Example 6 except that an ITO film is used as the rear electrode 63.

In the liquid crystal display obtained, the pixel defect becomes significant after the bending tests of 500 times, and thus the element is inferior in stability to Example 6.

Example 7

The light control device 70 shown in FIG. 7 is produced. An electrochromic layer is used as the light control layer 71. The rear electrode 73 is formed in the same manner as the negative electrode in Example 3. The front electrode 72 is formed in the same manner as the positive electrode in Example 3. An amorphous film including $WO_3$ is formed on the front electrode 72 by RF magnetron sputtering. The substrate of the front electrode 72 is attached to the substrate of the rear electrode 73 via a spacer. Subsequently, a lithium chloride solution is injected and the inlet is sealed. An electrolyte layer including the lithium chloride solution and an electrochromic layer 71 including a $WO_3$ film are formed in the above manner.

The light control device 70 obtained exhibits a transmittance of 70 to 80% in a transparent state and is flexible and light. Additionally, in the light control device 70, no change is observed in the display performance after the bending tests of 500 times.

Comparative Example 8

In Comparative example 8, a light control device is produced in the same manner as Example 7 except that an ITO film is used as the rear electrode 73.

In the light control device obtained, a partially deteriorated light control region becomes apparent after the bending tests 500 times, and thus the device is inferior in stability to Example 7.

Example 8

The organic EL device 50 shown in FIG. 5 is produced. It is produced in the same manner as Example 4 except that stainless steel foil (SUS304) is used as the positive electrode 53 and an $MoO_3$ vacuum-deposited film (10 nm) is used as the hole injection layer 55.

In the organic EL device 50 obtained, although light emitted from the positive electrode 53 is lost, reflected light is given. Thus, the amount of light emitted from the positive electrode 53 is increased. Further, the organic EL device 50 has a high light-emitting efficiency, shows relatively low deterioration of output performance even in the case of simple sealing and not containing water removers or oxygen removers, and is light and flexible.

Example 9

A thin-film silicon film is used as the photoelectric conversion layer 41 to produce the solar cell device 40 shown in FIG. 4. A microcrystal (n-i-p) Si layer and a buffer (oxide film) layer are formed on the negative electrode 42. An amorphous (p-i-n) Si layer is produced on the positive electrode 43. The buffer (oxide film) layer and the microcrystal (n-i-p) Si layer are subjected to vacuum lamination press at 100° C. under reduced pressure so as to contact both the layers and the solar cell device 40 is produced. Other configurations are the same as those of Example 3.

The solar cell device 40 obtained has a high energy conversion efficiency. Even if neither the water remover nor the oxygen remover is contained, deterioration of output power is relatively low due to simple sealing. Additionally, the solar cell device 40 is light and flexible.

Example 10

The solar cell device 40 shown in FIG. 4 is produced. The negative electrode 42 in Example 3 is changed. Specifically, a carbon nanotube having carbon atoms partially substituted with nitrogen atoms is used as the carbon substance in place of the planar single-layered graphene having carbon atoms partially substituted with nitrogen atoms. Other configurations are the same as those of Example 3.

As for the carbon nanotube having carbon atoms partially substituted with nitrogen atoms, an unsubstituted multi-layered carbon nanotube with an average diameter of 20 nm is treated in nitrogen plasma (0.1 millibar) with a magnetron sputtering apparatus (13.56 MHz, 150 W) for 30 minutes. The single-layered carbon nanotube is dispersed in water and spin-coated onto a substrate to form the negative electrode 42.

The ratio of nitrogen atoms to carbon atoms of the carbon substance measured by XPS is from 1/200 to 3/200 under the conditions. The ratio of oxygen atoms to carbon atoms of the carbon substance measured by XPS is from 1/100 to 1/200. In the X-ray photoelectron spectroscopy (XPS) with the 1 s electron of the nitrogen atoms, the ratio of the intensity at 398.5 eV to the intensity at 401.2 eV is from 2/35 to 1/2.

The solar cell device 40 to be obtained in the above manner has a high energy conversion efficiency and is light and flexible.

Example 11

Figure 8:
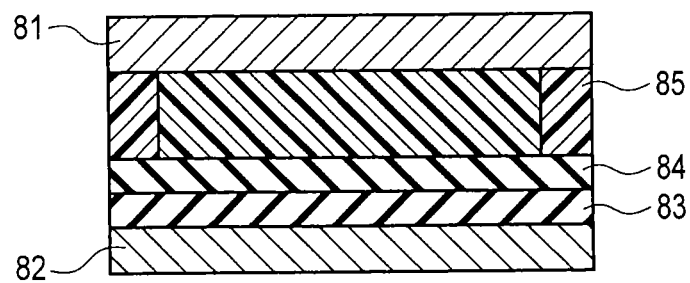
FIG. 8 is a schematic view showing a solar cell device of Example 11.

FIG. 8 is a schematic view showing a transparent solar cell device having a partially different structure from the solar cell device 40 shown in FIG. 4.

A positive electrode 81 in a solar cell device 80 shown in FIG. 8 is a conductive material formed on a glass substrate. Specifically, the conductive material prepared by laminating a metallic substance including silver nanowires to a carbon substance which includes planar single- and multi-layered graphenes having carbon atoms partially substituted with nitrogen atoms; and forming on a glass substrate is used as the positive electrode 81.

In order to form the positive electrode 81, the silver nanowires (with an average diameter of 110 to 130 nm and an average length of 25 to 30 μm) are dispersed in methanol at a concentration of 3 mg/ml to prepare a dispersion liquid. Single-layered and multi-layered oxidized graphenes obtained by oxidizing graphite are dispersed in water at a concentration of 3 mg/ml to prepare a dispersion liquid.

A methanol dispersion liquid containing silver nanowires is applied onto a glass substrate using an applicator to form a silver nanowire film. The dispersion liquid of oxidized graphene is spin-coated onto the silver nanowire film to form a film and dried it. Thereafter, the resulting film is left in hydrated hydrazine vapor at 90° C. for 1 hour, followed by heating at 200° C. for 1 hour in vacuum to obtain a conductive material. The conductive material has a surface resistance of 10 to 20Ω/□ and a light transmission at 550 nm of 75 to 80%, and thus it is used as the transparent positive electrode 81.

Subsequently, a mixed salt obtained by mixing $TiCl_4$, NaCl, and KCl at a mass ratio 1:1:1 is heated to 400° C. and melted to prepare a molten salt. A fluorine-doped tin oxide transparent conductive film (negative electrode) 82 is immersed in the molten salt together with a platinum electrode. A titanium metal thin film with a mass reduced thickness of 100 nm is formed on the surface of the negative electrode 82 by applying a current of 10 A/m² to the negative electrode 82 as a cathode. When the surface of the titanium metal thin film is observed with a scanning electron microscope, aggregates with a dendritic structure in height of about 1 μm are observed.

The titanium metal thin film formed on the surface of the negative electrode 82 is immersed in a solution of borate chloride (0.5 mol/l) together with a platinum electrode. A voltage of 150 V is applied to the negative electrode 82 for 5 minutes. Accordingly, the titanium metal is oxidized to form a titanium oxide thin film. Thereafter, the titanium oxide thin film is sintered at 400° C. for 5 hours to form an n-type transparent semiconductor layer 83. When the surface of the formed semiconductor layer 83 was observed with the scanning electron microscope, aggregates with a dendritic structure in height of about 3 μm were observed.

The dye represented by Chemical formula 1 below was dissolved in a solvent to prepare a dye solution. The transparent semiconductor layer 83 was immersed in the dye solution. The dye was adsorbed and supported on the transparent semiconductor layer 83 by heating to form a dye layer 84.

(Chemical formula 1)

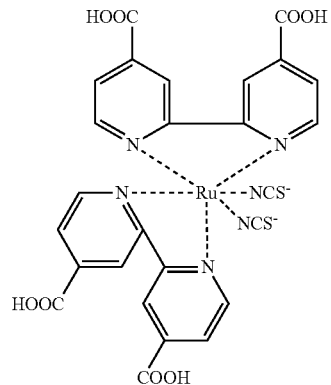

The glass substrate having formed the positive electrode 81 thereon and the surface of the dye layer 84 are attached and sealed with a seal adhesive (e.g., an epoxy-based resin) 85 via a 2-μm-thick spacer (not shown) so that the glass substrate and the dye layer 84 are opposed to each other. Thereafter, a propylene carbonate solution prepared by dissolving iodine and tetraethylammonium iodides (charge transport layer) is injected under vacuum to produce the solar cell device 80.

The solar cell device obtained has a high energy conversion efficiency and a long life-time.

Comparative Example 9

In Comparative example 9, the silver nanowires of the positive electrode 81 are not used in the structure of Example 11. Other configurations are the same as those of Example 11.

In the solar cell device obtained, the electric resistance of the electrodes is high, and thus the energy conversion efficiency is lower than that in Example 11.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A conductive material comprising:
    a carbon substance having at least one dimension of 200 nm or less, the carbon substance comprising a graphene selected from a single-layered graphene and a multi-layered graphene, a part of carbon atoms constituting the graphene being substituted with a nitrogen atom; and
    a metallic substance mixed with and/or laminated to the carbon substance, the metallic substance comprising at least one of a metallic particle and a metallic wire.

2. The conductive material according to claim 1, the transmittance of the conductive materials at 550 nm wavelength is 60% or more.

3. The conductive material according to claim 1, wherein the metallic substance comprises the metal particle having at least one dimension of 200 nm or less.

4. The conductive material according to claim 1, wherein the metallic substance comprises the metal wire having at least one dimension of 200 nm or less.

5. The conductive material according to claim 1, wherein the carbon substance has an atomic ratio of nitrogen to carbon (N/C) of from 1/5 to 1/1000.

6. The conductive material according to claim 1, wherein $I_{401.2}$ representing an intensity at 401.2 eV is higher than $I_{398.5}$ representing an intensity at 398.5 eV in X-ray photoelectron spectrum with a 1 s electron of the nitrogen atom.

7. The conductive material according to claim 1, further comprising an electron injection material mixed and/or laminated with the conductive material.

8. The conductive material according to claim 7, wherein the electron injection material has electron injection performance and is selected from the group consisting of alkali metal salt, alkaline earth metal salt, an n-type oxide semiconductor, an oligomer having a π electron system substituted with an electron withdrawing group, and a polymer having a π electron system substituted with an electron withdrawing group.

9. The conductive material according to claim 1, wherein a ratio of $I_{O1s}/I_{C1s}$ is 1/10 or less, where $I_{O1s}$ is a peak intensity at 530 eV of oxygen atoms and $I_{C1s}$ is a peak intensity of C1s at 285 eV of carbon atoms in X-ray photoelectron spectrum.

10. The conductive material according to claim 1, wherein the carbon substance has a thickness of 100 nm or less.

11. The conductive material according to claim 1, wherein the metallic substance is selected from Ag, Al, Cu, Au, W, Mo, and an alloy thereof.

12. A conductive material which is transparent comprising:
    a carbon substance having a graphene selected from a single-layered graphene and a multi-layered graphene, and a part of carbon atoms constituting the graphene being substituted with a nitrogen atom; and
    a metallic substance laminated to the carbon substance, the metallic substance comprising a metallic wire of which diameter is 200 nm or less.

13. An electric device comprising:
    a pair of electrodes; and
    a functional layer sandwiched between the electrodes,
    one of the pair of electrodes being a transparent electrode made from a conductive material comprising a carbon substance and a metallic substance mixed with and/or laminated to the carbon substance, the carbon substance having at least one dimension of 200 nm or less and comprising a graphene selected from single-layered and multi-layered graphenes, a part of carbon atoms in the graphene being substituted with a nitrogen atom, the metallic substance comprising at least one of a metallic particle and a metallic wire.

14. An electric device cording to claim 13, wherein the metallic substance comprises the metal particle having at least one dimension of 200 nm or less.

15. An electric device cording to claim 13, wherein the metallic substance comprises the metal wire having at least one dimension of 200 nm or less.

16. The electric device according to claim 13, wherein the functional layer generates photovoltaic power and the transparent electrode is positioned at a light incidence side receiving light.

17. The electric device according to claim 13, wherein the functional layer is divided into pixels configured to display an image and the transparent electrode is opposed to a display side displaying image.

18. The electric device according to claim 13, wherein the functional layer emits light and the transparent electrode is positioned at a side for taking out light.

19. The electric device according to claim 13, wherein the pair of electrodes are transparent.

20. The electric device according to claim 13, further comprising an electron injection layer.

* * * * *